United States Patent
Freire

(10) Patent No.: US 10,264,697 B2
(45) Date of Patent: Apr. 16, 2019

(54) PROTECTIVE CABINET FOR STORAGE AND PROTECTION OF EQUIPMENT IN GENERAL

(71) Applicant: Daniel Fazenda Freire, São Paulo (BR)

(72) Inventor: Daniel Fazenda Freire, São Paulo (BR)

( * ) Notice: Subject to any disclaimer, the term of this patent is extended or adjusted under 35 U.S.C. 154(b) by 0 days.

(21) Appl. No.: 14/895,035

(22) PCT Filed: Oct. 13, 2015

(86) PCT No.: PCT/BR2015/050179
§ 371 (c)(1),
(2) Date: Dec. 1, 2015

(87) PCT Pub. No.: WO2017/063057
PCT Pub. Date: Apr. 20, 2017

(65) Prior Publication Data
US 2018/0213670 A1    Jul. 26, 2018

(51) Int. Cl.
| | |
|---|---|
| *H05K 7/18* | (2006.01) |
| *H05K 7/14* | (2006.01) |
| *H05K 7/20* | (2006.01) |

(52) U.S. Cl.
CPC ......... *H05K 7/1489* (2013.01); *H05K 7/1488* (2013.01); *H05K 7/1492* (2013.01);
(Continued)

(58) Field of Classification Search
CPC ............. H05K 7/1492; H05K 7/20709; H05K 7/1489; H05K 7/1495; H05K 7/18; H02B 1/01; H02B 1/28; H02B 1/34; H02B 1/56
See application file for complete search history.

(56) References Cited

U.S. PATENT DOCUMENTS

| | | | |
|---|---|---|---|
| 5,761,797 A * | 6/1998 | Besserer | H02B 1/01 29/825 |
| 7,268,998 B2 * | 9/2007 | Ewing | H05K 7/1492 174/59 |

(Continued)

FOREIGN PATENT DOCUMENTS

| | | |
|---|---|---|
| BR | PI94082375 A | 8/1997 |
| BR | MU8502403 1 | 11/2005 |
| BR | PI06030807 A | 3/2008 |

*Primary Examiner* — Dhiru R Patel
(74) *Attorney, Agent, or Firm* — Wood Herron & Evans LLP

(57) ABSTRACT

A protective cabinet for storage and protection of equipment, wherein the cabinet (1) includes lateral (1a), upper (1b) and lower (1c) walls, and is provided with swivel rollers (2) and leveling support feet (3), as well as with front (4) and posterior (5) doors. The upper wall (1b) of the cabinet (1) is inclined and provided with external integrated hooks (7), and the cabinet (1) is further internally provided with sets of vertical profiles (8) provided with orifices (8a), as well as with vertical supports (9) provided with shafts (9a), the orifices (8a) and shafts (9a) adapted to receive the installation and the fixing of several types of components/devices. The protective cabinet (1) is provided with a mobile rear compartment (11), which may provide accommodation for a ventilation/refrigeration/acclimatization system of the cabinet. The rear compartment (11) includes lateral (11a), upper (11b), lower (11c) and posterior (11d) walls, with the upper wall (11b) being inclined, and the posterior (11d) wall being provided with openings (11e) for passing of electrical wiring and of components of the ventilation/refrigeration/acclimatization systems of the cabinet. The compartment (11) may further include swiveling rollers (12).

10 Claims, 15 Drawing Sheets

DET. B₁

(52) U.S. Cl.
CPC ............. *H05K 7/1495* (2013.01); *H05K 7/18* (2013.01); *H05K 7/20709* (2013.01)

(56) References Cited

U.S. PATENT DOCUMENTS 7,857,214 B2    12/2010   Saliaris
9,066,441 B2     6/2015   Kilian \* cited by examiner

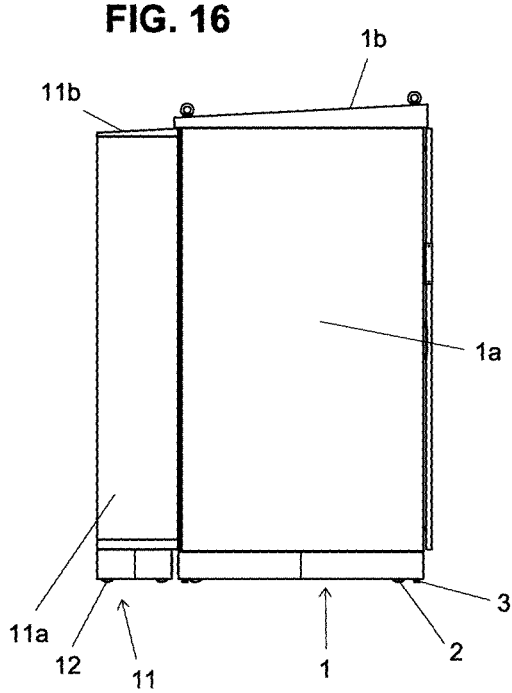
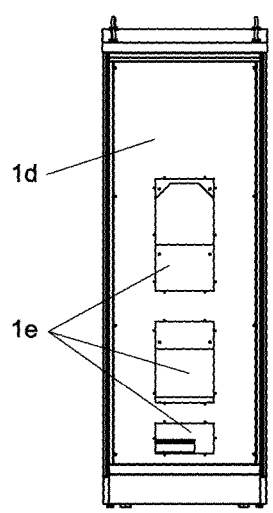
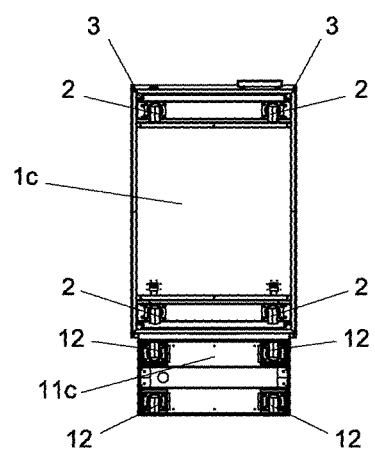

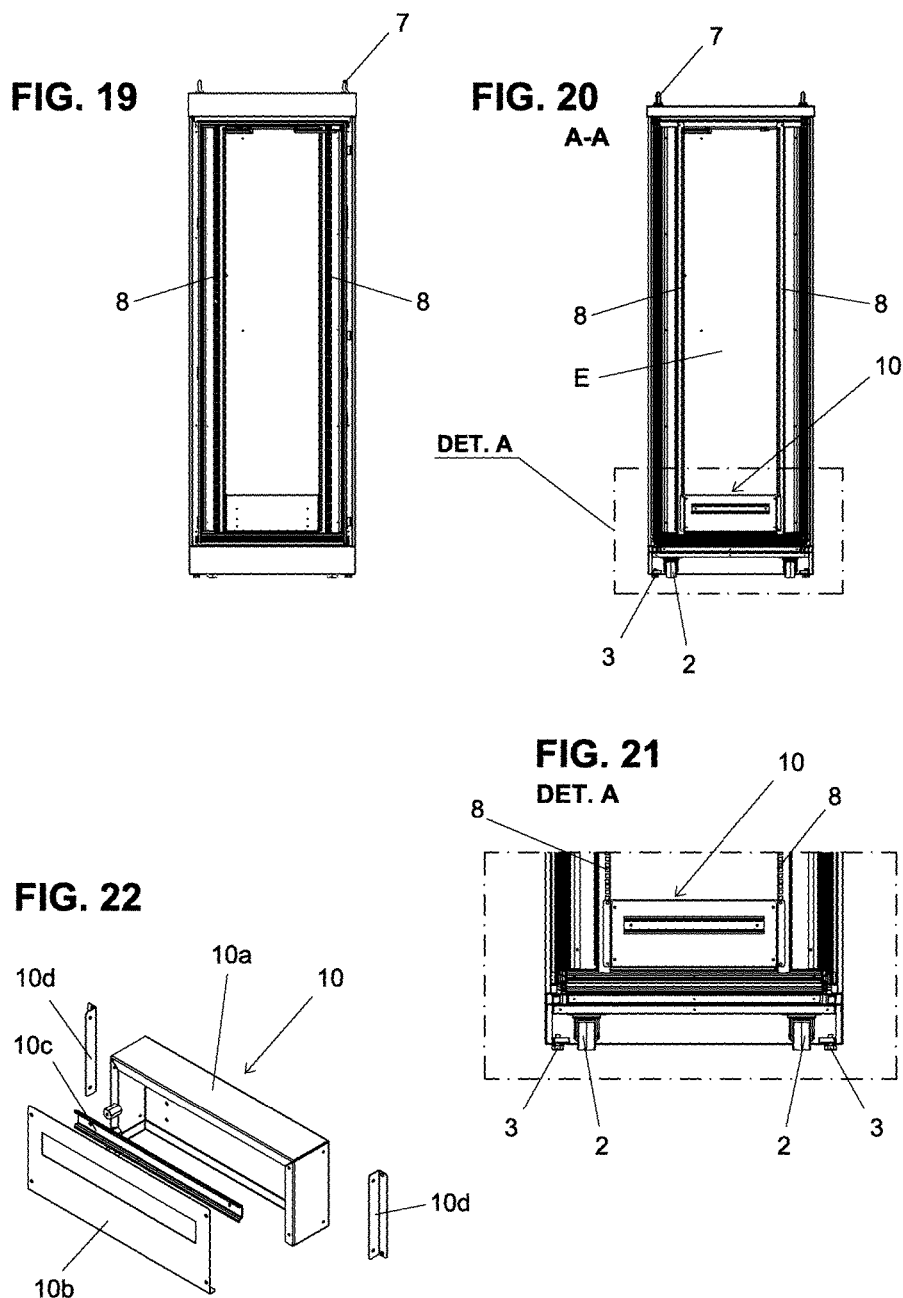

DET. B₁

B-B

DET. B₂

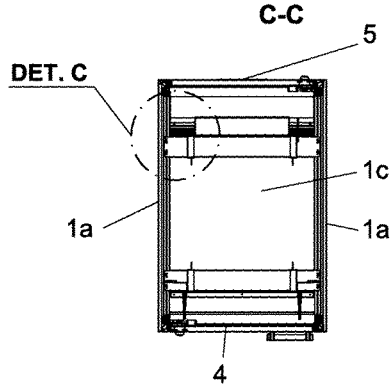
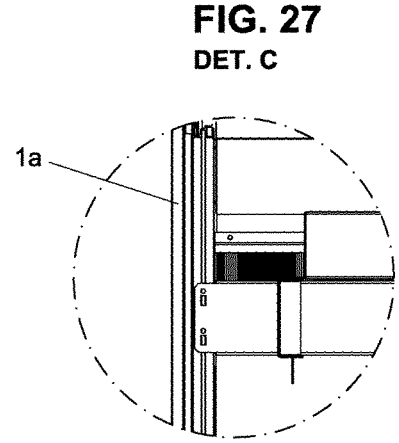
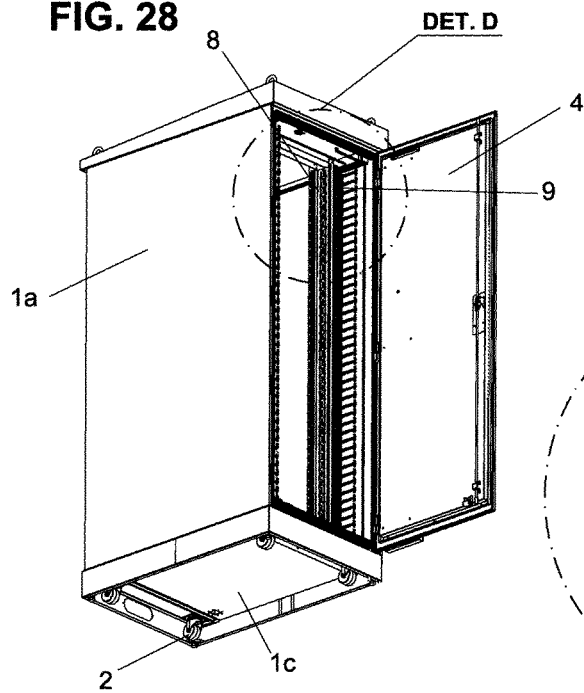
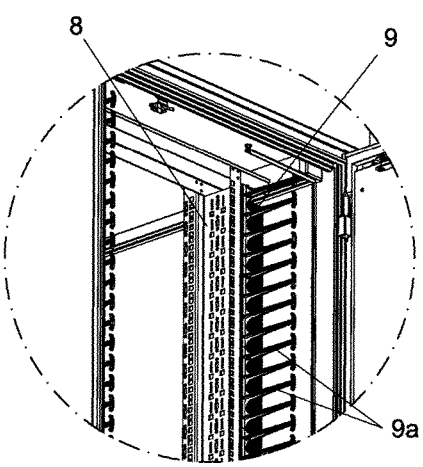

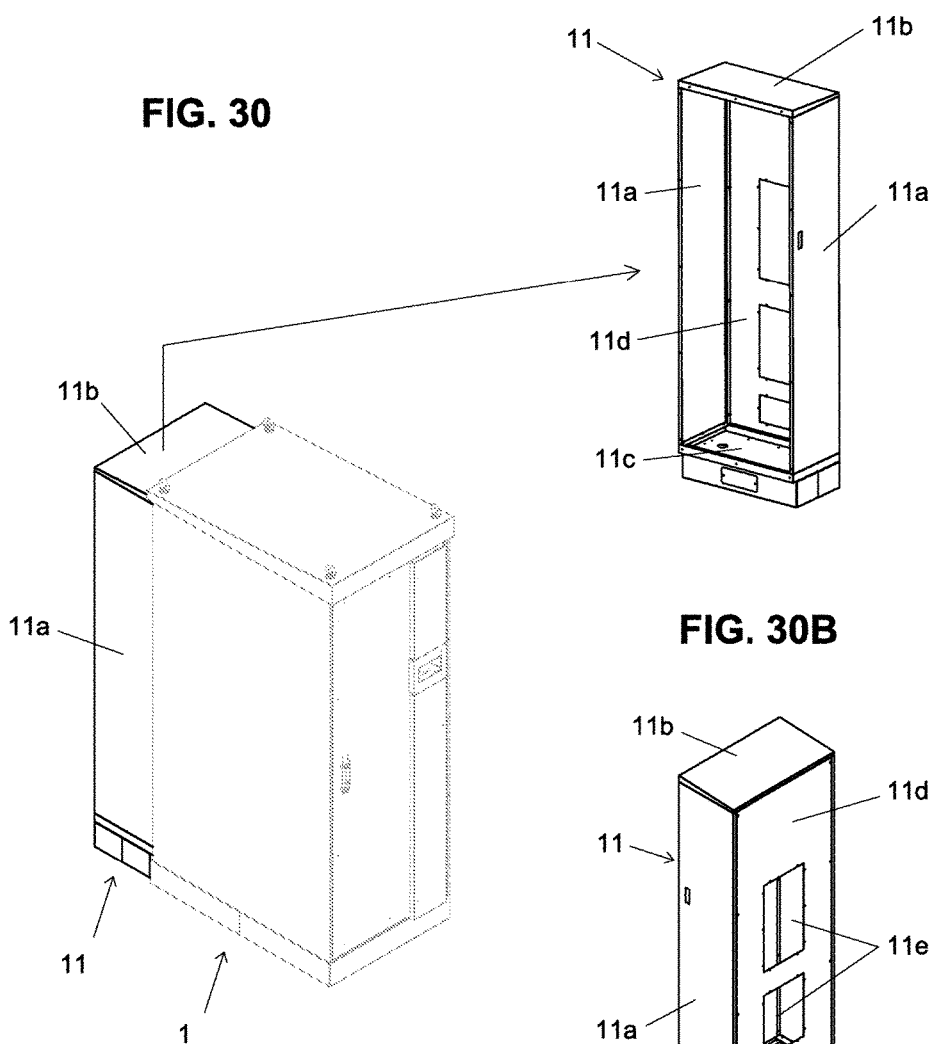

FIG. 31
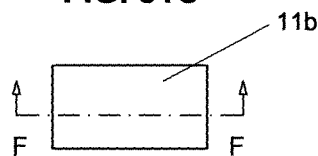
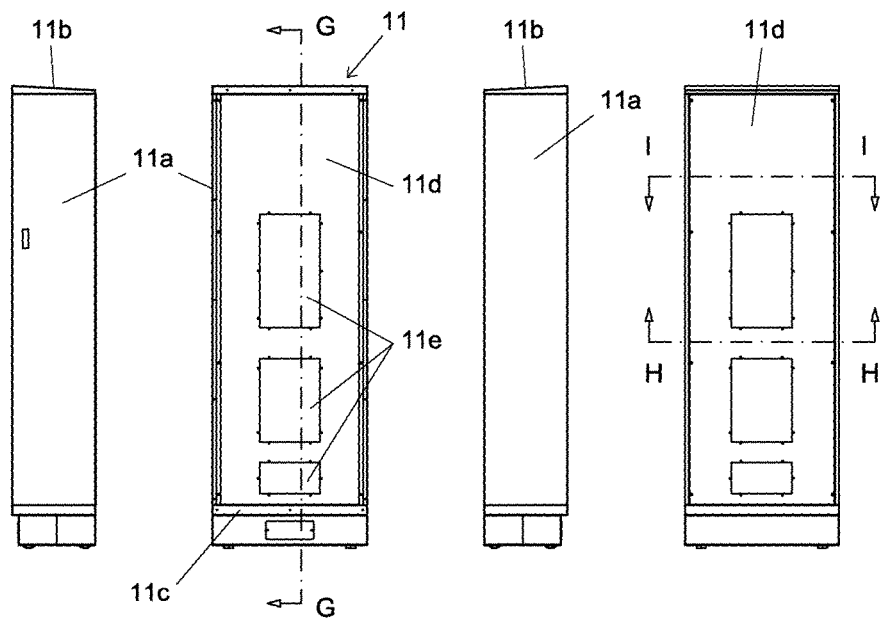
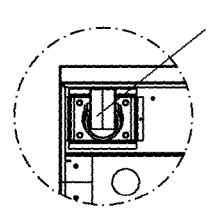
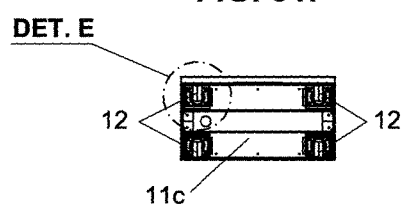

FIG. 32
FIG. 32C
H-H
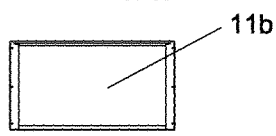
FIG. 32A
F-F
FIG. 32B
G-G
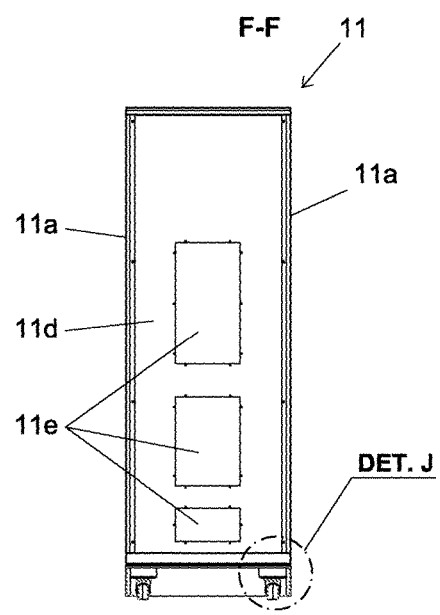
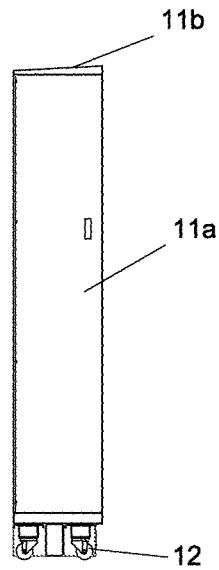
FIG. 32D
I-I
FIG. 32E
DET. J
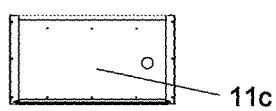
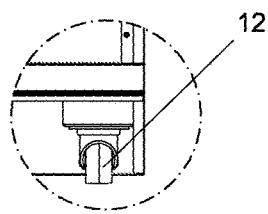

PROTECTIVE CABINET FOR STORAGE AND PROTECTION OF EQUIPMENT IN GENERAL

This patent of invention refers to a new protective cabinet for storage and protection of equipment in general, more specifically, IT (information technology) equipment, cabinet such that presents, as differentials in relation to the models known in the art, both its way of construction and the provision of a series of innovative functional particularities, which, jointly, have resulted in a product substantially improved in relation to the similar ones now available in the marketplace.

DESCRIPTION OF THE STATE OF THE ART

Already are widely known in the art protective cabinets specifically intended to the storage and protection of data, systems, programs (software), components (hardware) and other IT (information technology) equipment used in the most varied types of commercial establishments (among them, offices, corporations, stores, bank agencies, etc.). Such protective cabinets are commonly called "Data Centers" or "Data Bunkers".

Among the numerous models of protective cabinets known in the art and already widely employed, both in the domestic marketplace as well as in the international marketplace, are mentioned those that are object of the following patent documents: BR PI 9408237-5; BR MU 8502403-1; BR PI 0603080-7; U.S. Pat. Nos. 7,857,214; and 9,066,441.

In a general way, the usual protective cabinets consist of a cabinet (or "rack") provided with supporting feet and/or suitable swivel rollers, and provided with access doors to the equipment disposed inside them, the internal portion of said cabinet being commonly provided with shelves and/or rails on which are duly supported and/or fitted the components and the electro-electronic devices to be duly stored and protected.

Many of these protective cabinets are composed by an internal shielded structure which, combined to systems of protection against fire, vandalism and theft, make this kind of equipment sufficiently resistant and safe, and consequently, quite reliable, satisfactorily accomplishing in this way their intended purposes.

And several of these protective cabinets further incorporate appropriate systems of acclimatization, which allow to provide and regulate the ventilation and the cooling of their interior, in such a way as to preserve the electro-electronic components stored therein against voltage and/or force surcharges, as well as against the excessive increase of the temperature.

Thus, protective cabinets ("Data Centers" or "Data Bunkers") are common products, already used since a long time in the marketplace, in several areas of the electronics and informatics fields, protective cabinets which are shown in several and different models, depending on the manufacturer.

Such protective cabinets differentiate from one another by their construction characteristics, which vary from model to model, as well as by their functionality, depending on how they allow the arrangement, in their interior, of the electro-electronic components and devices to be stored and protected.

In function of their construction and of their functionality, such protective cabinets have varied costs, which costs are proportional to the degree of efficiency and of protection provided by the same. Obviously, the greater the said degree of efficiency and of security of the protective cabinet, the greater will be its final cost.

Therefore, the ideal procedure would be one obtaining a protective cabinet extremely functional, practical, safe and efficient, which satisfactorily accomplish the intended purposes of storing and protecting the equipment kept by it, but, without its cost being excessively high.

BRIEF DESCRIPTION OF THE INVENTION

The present patent of Invention refers to a new protective cabinet for storage and protection of equipment in general, which protective cabinet whose extremely simple construction allowed to provide an easy and fast assembling of its components, accelerating, in this way, its manufacturing process. On the other hand, besides its new manner of construction, the protective cabinet herein innovated passed to present several particularities that increased even more its functionality.

One of these particularities consist in the fact of the upper portion of the protective cabinet now becoming inclined. Such inclination being intended to prevent the accumulation of rain water upon the protective cabinet, in the cases in which the same is used in open and uncovered areas (outdoor applications); and to minimize the inconveniences of such water during the execution of maintenance services in rainy days, the inclination of said upper wall shows itself lowering from front to rear, so as to direct the flow of the water to the rear part of the cabinet.

Additionally, the upper part of the protective cabinet became provided with external hooks disposed near to its four corners, which hooks constitute means for receiving cables, ropes, shafts or any other elements regularly employed in the cargoes transport; in this way, with such hooks already incorporated to the protective cabinet herein innovated, it may be more easily transported, either from the factory to the establishments in which it will be installed, or in the interior of the very establishments, when a change of layout is required, with the consequent relocation of the protective cabinets from one place to another.

Other particularity of the protective cabinet herein improved consists in the full use of its internal space. Thus, in the interior of the protective cabinet, are provided at least four sets of vertical profiles, aligned two by two, said profiles having "U" shaped lying down cross section, whose branches are provided with a multiplicity of orifices of different shapes and dimensions, which allow the easy and fast installation of the most varied types of electro-electronic components and devices, said components/devices being fixed in said orifices by fitting, tying or any other form of fixing. Such sets of vertical profiles may have their position adjusted, sometimes forward, and sometimes rearward, depending on the necessity and/or on the type of component/device that will be stored in the interior of the protective cabinet. Additionally, also depending on the need and/or type of component/device that will be stored in the interior of the protective cabinet, said sets of vertical profiles may be mounted very close to the internal faces of the lateral walls of the cabinet, or slightly distant from them, so as to outline one, two or three internal spaces, independent one of the other, for placing said components/devices.

Still in the interior of the protective cabinet, in its most frontal portion, it is provided a pair of vertical supports provided with a multiplicity of horizontal shafts, which allow the easy and fast installation of other types of electro-electronic components and devices, said components/devices being fixed in said shafts equally by fitting, tying or any other form of fixing.

Other differential of the protective cabinet herein innovated in relation to the usual ones consists in the fact of the same being provided with a rear compartment, separated from it and optionally fitted in it, which compartment is intended to lodge the system of ventilation/refrigeration/acclimatization of the cabinet, said rear compartment being mobile, so as to be easily moved, capable of being sometimes approximated sometimes placed away from the cabinet, according to the need, in this way allowing easy access to the apparatuses of said system, both when of its installation, and when of the execution of the required maintenance services.

Further, among the innovative construction particularities provided in the protective cabinet herein innovated, may be mentioned the following:

the protective cabinet is provided with system of fire detection and fighting, being that the cables for passing of the wires is provided with insulation against flames;

the protective cabin walls prevent coating capable of resisting to fires during until 60 minutes;

the protective cabinet features a high degree of safety, designed for IP65 Protection Grade of the standards established by the International Electro-Technical Commission (IEC);

the protective cabinet is provided with a complete monitoring system, which provides sensors of temperature, humidity, smoke, vibration, flooding and door opening, a "tablet" being provided in its front portion, for displaying of the monitored data;

the protective cabinet is provided with switchboard incorporated to it, for electric power distribution; and the protective cabinet is provided with "no break" also incorporated to it.

With this new constructivity, and with the forecasting of the above mentioned innovative particularities, it was achieved a protective cabinet substantially more practical, functional and efficient than the models already known in the art, besides being extremely safe, thus advantageously attending the purposes of storing and protecting the IT equipment disposed in its interior; additionally, the protective cabinet herein improved is sold in the marketplace relatively cheaper than the usual models existent on the market, without, however, compromising its characteristics of functionality, practicality and safety.

DESCRIPTION OF THE DRAWINGS

Complementing this description, so as to obtain a better comprehension of the characteristics of this invention, it will be presented drawings of the protective cabinet herein innovated, which drawings are merely for illustration purposes and without limiting character, specified as follows.

FIGS. 7 to 32 described next will refer only to one of the versions of said protective cabinet, more particularly, to the version of the large size protective cabinet (shown in the FIGS. 1, 2 and 6), as well as to its embodiment provided with rear compartment (shown in FIGS. 3 and 6A), being that, obviously, all the internal and external construction details illustrated in the said FIGS. 7 to 32 equally apply to the other two protective cabinet versions (small and medium size cabinets), respectively illustrated in the FIGS. 4/4A, and 5/5A.

FIGS. 7 to 12 illustrate the protective cabinet herein innovated through all of its views, namely: right lateral view (FIG. 7), front view (FIG. 8), upper view (FIG. 9), left lateral view (FIG. 10), posterior view (FIG. 11) and lower view (FIG. 12).

FIGS. 13 to 18 illustrate said protective cabinet herein provided with rear compartment, likewise through all of its views, namely: right lateral view (FIG. 13), front view (FIG. 14), upper view (FIG. 15), left lateral view (FIG. 16), posterior view (FIG. 17) and lower view (FIG. 18).

FIG. 19 is a front view of the protective cabinet illustrated in the FIGS. 6 and 6A, without its front door.

FIG. 20 is a cross-sectional view of said protective cabinet, according to line A-A shown in the FIGS. 7 and 13.

FIG. 21 is an enlarged detail of the internal lower part of said protective cabinet, shown in Detail "A" in the preceding figure.

FIG. 22 illustrates, through exploded perspective, the circuit-breakers box foreseen in the internal lower portion of the protective cabinet, which box may be visualized in the detail "A" of FIG. 21.

FIG. 23 is a lateral cross-sectional view of said protective cabinet, according to line B-B shown in the FIGS. 8 and 14.

FIG. 24 is an enlarged detail of the internal upper portion of said protective cabinet, shown in Detail "$B_1$" in FIG. 23.

FIG. 25 is an enlarged detail of the internal lower portion of said protective cabinet, shown in Detail "$B_2$" in the same FIG. 23.

FIG. 26 is an upper cross-sectional view of said protective cabinet, according to line C-C also shown in FIGS. 8 and 14.

FIG. 27 is an enlarged detail of the lateral wall of said protective cabinet, shown in Detail "C" in the preceding figure.

FIG. 28 is a lower perspective view of said protective cabinet, with its front door open.

FIG. 29 is an enlarged detail of the front upper portion of said protective cabinet, shown in Detail "D" in the preceding figure.

FIG. 30 is other perspective view of the protective cabinet, in the option in which the same is provided with the rear compartment, which is herein illustrated in stronger lines in relation to the protective cabinet itself, illustrated in weaker lines.

FIGS. 30A and 30B show only the aforementioned rear compartment, respectively through front perspective view and posterior perspective view.

FIG. 31 illustrates said rear compartment in all of its perspective views, namely: right lateral view (FIG. 31A), front view (FIG. 31B), and upper view (FIG. 31C), left lateral view (FIG. 31D), posterior view (FIG. 31E) and lower view (FIG. 31F).

FIG. 31G is an enlarged detail of the lower portion of said rear compartment, shown in Detail "E" in the preceding figure, showing one of its swivel rollers.

FIG. 32 illustrates said rear compartment by means of cross-sectional views, described as follows:

FIG. 32A is a front cross-sectional view of said rear compartment, according to line F-F shown in the FIG. 31C.

FIG. 32B is a cross-sectional lateral view of said rear compartment, according to line G-G shown in FIG. 31B.

FIG. 32C is a lower cross-sectional view of said rear compartment, according to line H-H shown in FIG. 31E.

FIG. 32D is an upper cross-sectional view of said rear compartment, according to line I-I also shown in FIG. 31E.

Finally, FIG. 32E is an enlarged detail of the lower portion of said rear compartment, shown in Detail "J" in FIG. 32A, showing one of its swivel rollers.

DETAILED DESCRIPTION OF THE INVENTION

Figure 1:
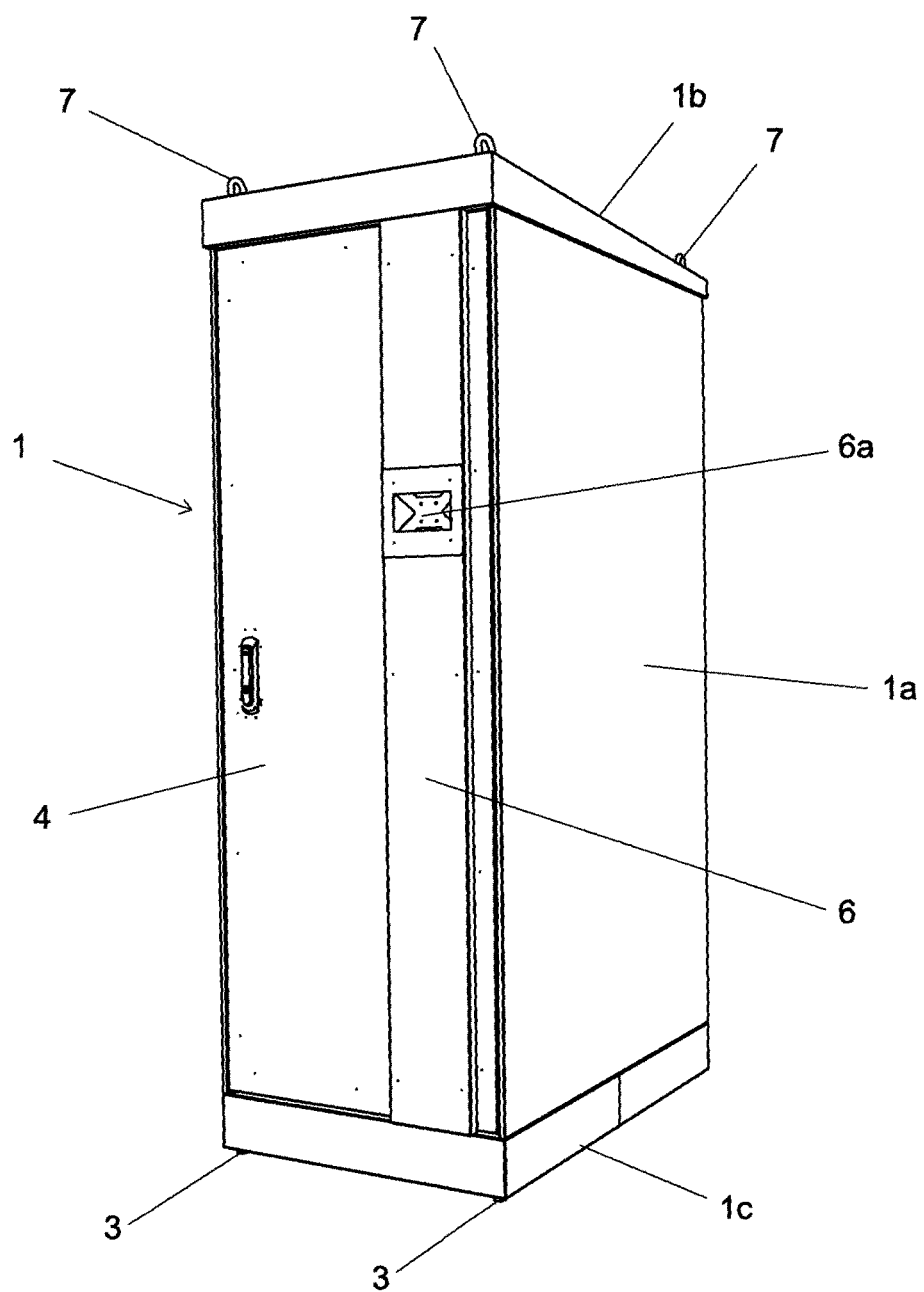
FIG. 1 is a frontal perspective of the subject protective cabinet, which, in FIG. 2, is illustrated with its front door open, so as to allow the visualization of its interior.

The object of the present Patent of Invention is a "PROTECTIVE CABINET FOR STORAGE AND PROTECTION OF EQUIPMENT IN GENERAL", said protective cabinet being configured by a cabinet (or "rack") (1) confectioned in suitable metallic material, and comprising a lateral walls (1a), upper (1b) and lower (1c), all of them formed by double plates of steel or similar material, whose internal spacing is filled with anti-flame mantle (detail enlarged in FIG. 26); said protective cabinet (1) is provided with swivel rollers (2) and of leveling supporting feet (3), and it is provided with front (4) and posterior (5) doors, for installation and posterior access to the equipment disposed in its interior, said front door (4) featuring a casting type identification plate (6) with illumination. The internal portion of said protective cabinet (1) is further provided with means for receiving and fixing the electrical and electronic components and devices to be duly stored in its interior.

Figure 2:
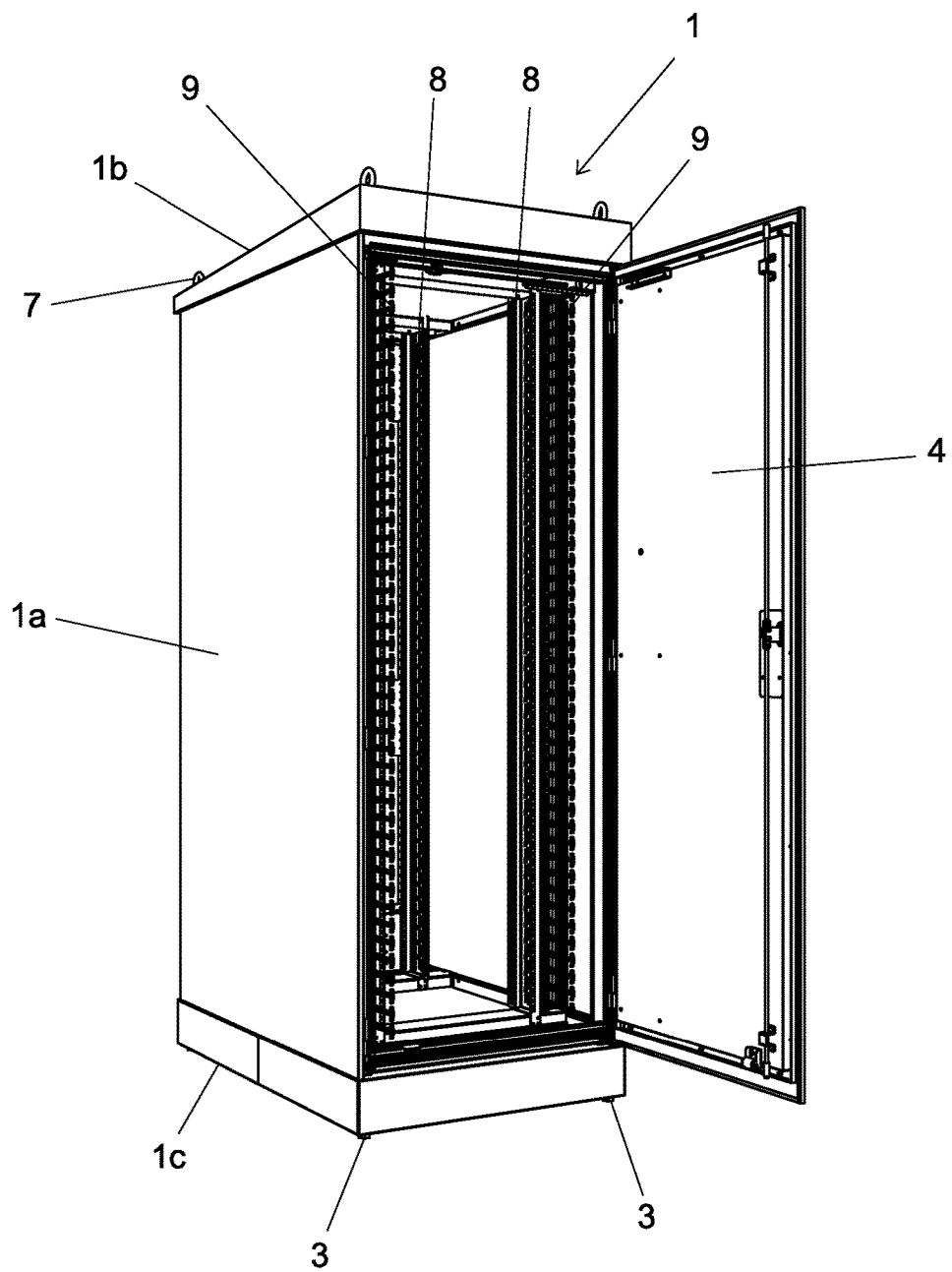
Figure 3:
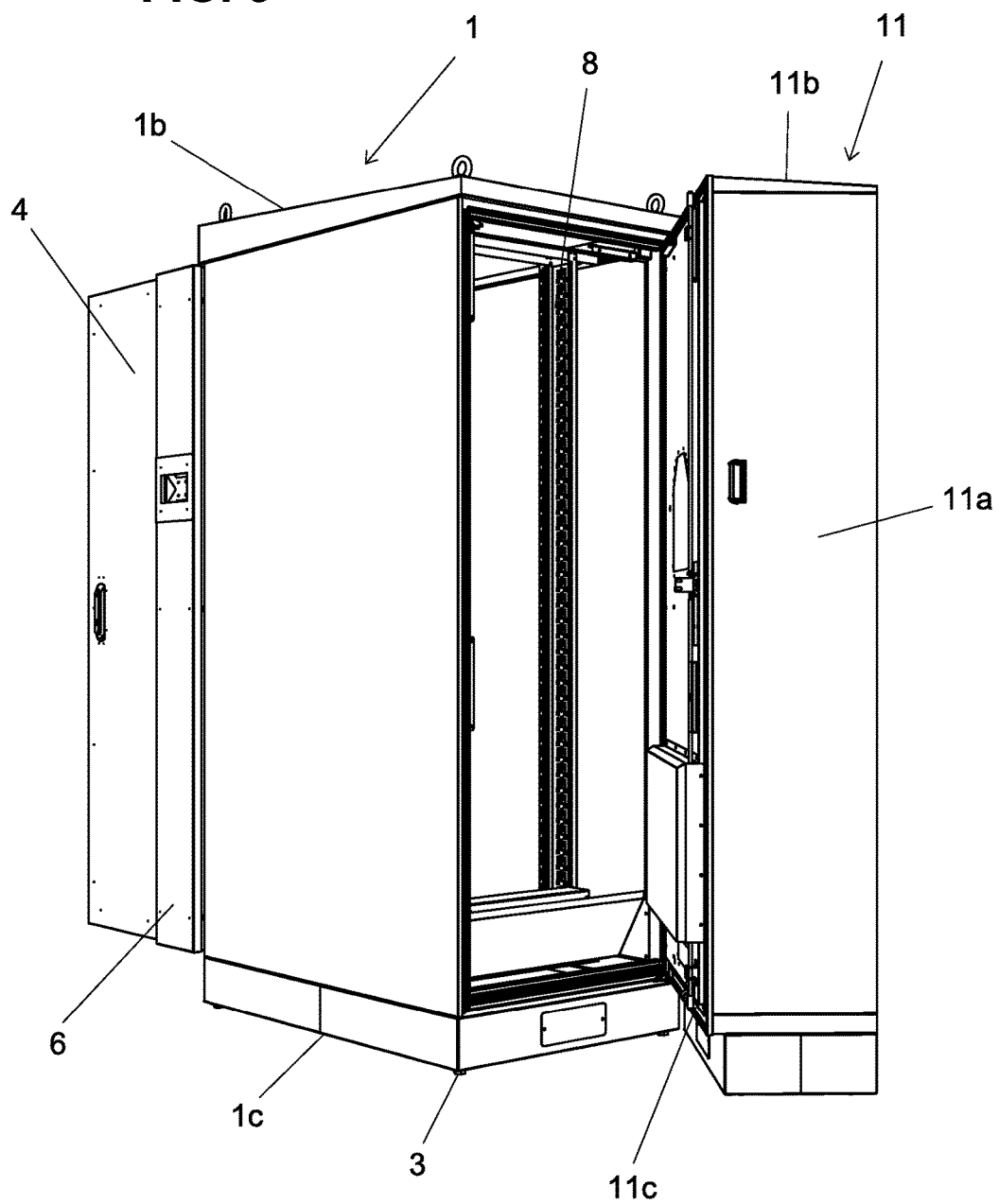
FIG. 3 is a posterior perspective of said protective cabinet, showing the possibility of the same receiving the coupling of a mobile rear compartment, to lodge the system of ventilation/refrigeration/acclimatization.
Figure 4:
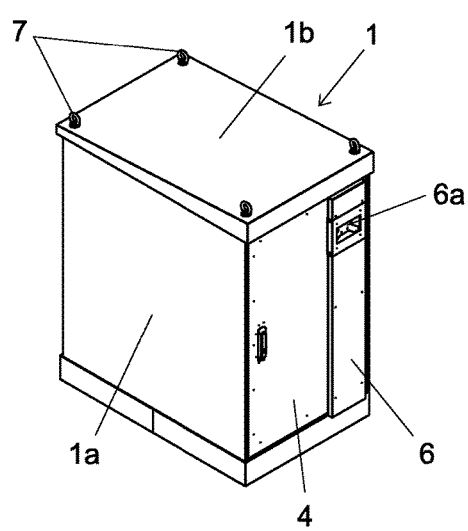
FIGS. 4, 5 and 6 are other perspectives of said protective cabinet, which is herein illustrated in three versions, which are herein presented exactly equal between themselves as to their construction and as to their internal e external details, said versions differentiating one from the other only as to their dimensions [small cabinet (FIG. 4), medium cabinet (FIG. 5) and large cabinet (FIG. 6)].
Figure 5:
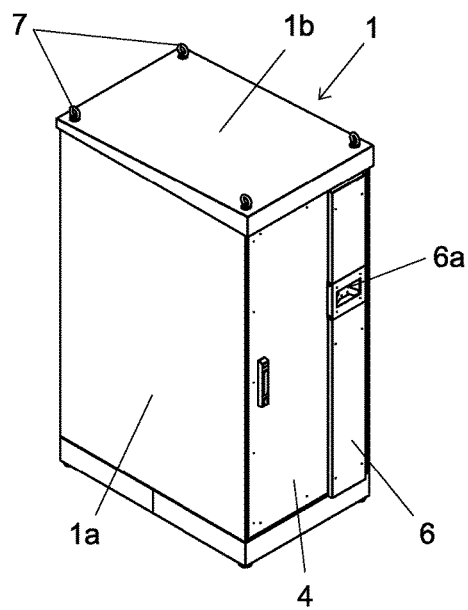
Figure 6:
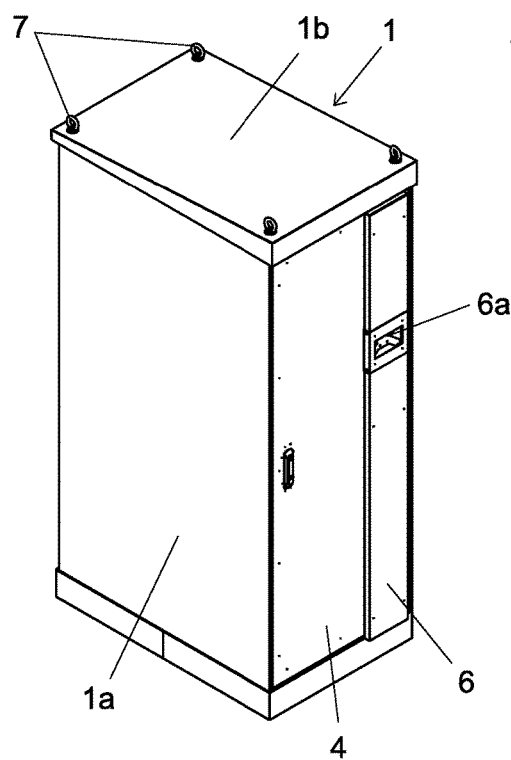

The protective cabinet herein innovated may vary as to its dimensions, being that, in title of exemplification, in this patent application three versions of the same have been presented, that is: small cabinet (FIG. 4), medium cabinet (FIG. 5) and large cabinet (FIGS. 1, 2 and 6), which versions present themselves exactly equal as to their construction and as to their internal and external details.

According to this invention, the upper wall (1b) of the cabinet (1) presents itself inclined, which inclination is intended to prevent the accumulation of rain water upon the cabinet, in the cases in which the same is used in areas open and uncovered (outdoor applications); and to minimize the inconveniences of this water during the execution of maintenance services in rainy days, the inclination of said upper wall (1b) features itself decreasing from forward to rearward, in order to direct the flow of the water to the rear part of the protective cabinet.

Further, the upper wall (1b) of said cabinet (1) is presented provided with integrated external hooks (7), disposed nearby its four corners, which hooks (7) constitute means for receiving of cables, ropes, shafts or any other elements usually employed in the cargoes transport, so as to facilitate the transport of the present protective cabinet.

Also according to this invention, the means for receiving and fixing the components and electro-electronic components and devices to be stored in the present cabinet are configured by at least four sets of vertical profiles (8) disposed in the interior of the cabinet (1), aligned two by two (as better shown in the FIGS. 2 and 3, 19 to 25, and 28 and 29), and by a pair of vertical supports (9) equally disposed in the interior of the protective cabinet (1), in its most frontal part, also duly aligned between themselves (as better shown in the same Figures).

With reference initially to the sets of vertical profiles (8) (FIGS. 19 to 25, 28 and 29), said profiles (8) preferably presents "U" shaped lying down cross section, whose branches are provided with a multiplicity of orifices (8a) of different shapes and dimensions, which allow the easy and fast installation of the most varied types of electro-electronic components and devices, said components/devices being fixed in said orifices (8a) by fitting, tying or any other form of fixing.

Figure 24:
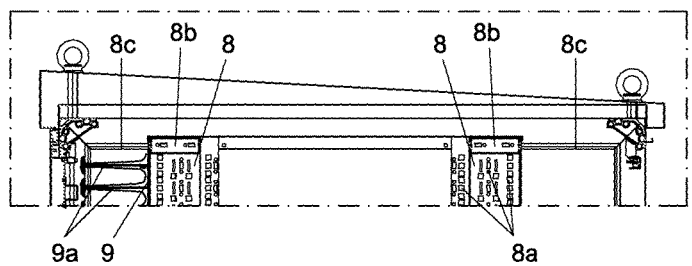
Figure 23:
Figure 25:
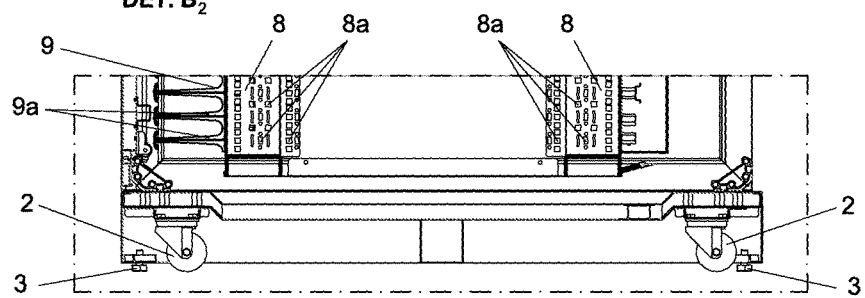

Such sets of vertical profiles (8) may have their position adjusted, sometimes ahead, sometimes further behind, depending on the need and/or of the type of component/device that will be stored in the interior of the protective cabinet. For such, and according as better illustrated in the enlarged detail of FIG. 24, are foreseen swivel rollers (8b) in the upper portion of said profiles (8), susceptible of sliding along rails (8c) conveniently provided in the internal upper portion of the cabinet (1).

Additionally, also depending on the need and/or on the type of component/device that will be stored in the interior of the protective cabinet, said sets of vertical profiles (8) may be assembled very nearby the internal faces of the lateral walls (1a) of the cabinet, such as illustrated in the FIGS. 19 and 20, delimiting, in this way, a central space (E) for placing the said components/devices, or else, may be assembled slightly away from the internal faces of the lateral walls (1a) of the protective cabinet (non-illustrated situation), so as to delimit one or two lateral spaces, irrespective of the central one (E), also for placing said components/devices.

As already mentioned, the arrangement of said sets of profiles (8) sometimes further ahead, sometimes further behind, or still, nearby the lateral walls (1a) of the cabinet (1) or placed away from them, will depend on the need and/or on the type of component/device that will be stored in the interior of the protective cabinet.

Concerning now the vertical supports (9) (FIGS. 23, 25, 28 and 29), said supports (9) are provided with a multiplicity of horizontal shafts (9a), equidistantly spaced one from the others, which equally allow the easy and fast installation of other types of electrical-electronic components and devices, said components/devices being fixed in said shafts (9a) also by fitting, tying or any other form of fixing.

In the internal lower portion of the cabinet (1), among the said vertical profiles sets (8), and behind the vertical supports (9), is provided a box of circuit-breakers (10), which is illustrated in the enlarged in FIG. 22, by means of exploded perspective view. Said circuit-breakers box (10) is formed by a parallelepiped-shaped body (10a) whose open front face is closed by plate (10b), being foreseen front (10c) and lateral (10d) bracing profiles.

Still according to this invention, the protective cabinet (1) may be provided with a rear compartment (11), separated from it and optionally fitted in it, which compartment (11) is intended to accommodate the ventilation/refrigeration/acclimatization system.

Figure 4A:
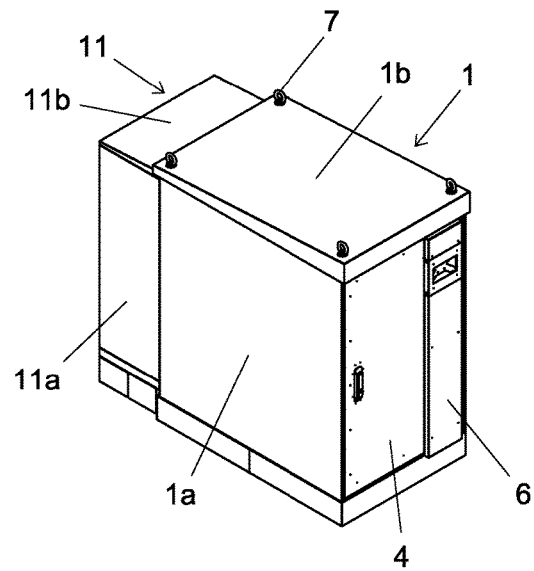
FIGS. 4A, 5A and 6A illustrate the same protective cabinets shown in FIGS. 4, 5 and 6, now in an embodiment in which they receive the coupling of the already mentioned mobile rear compartment to lodge the system of ventilation/refrigeration/acclimatization.
Figure 5A:
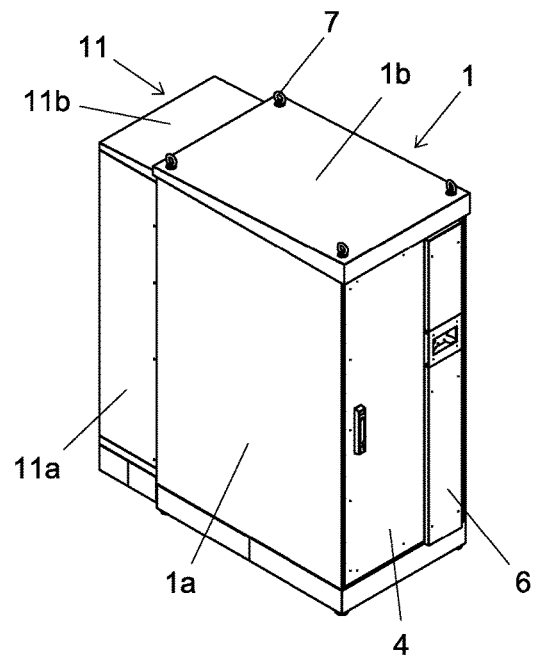
Figure 6A:
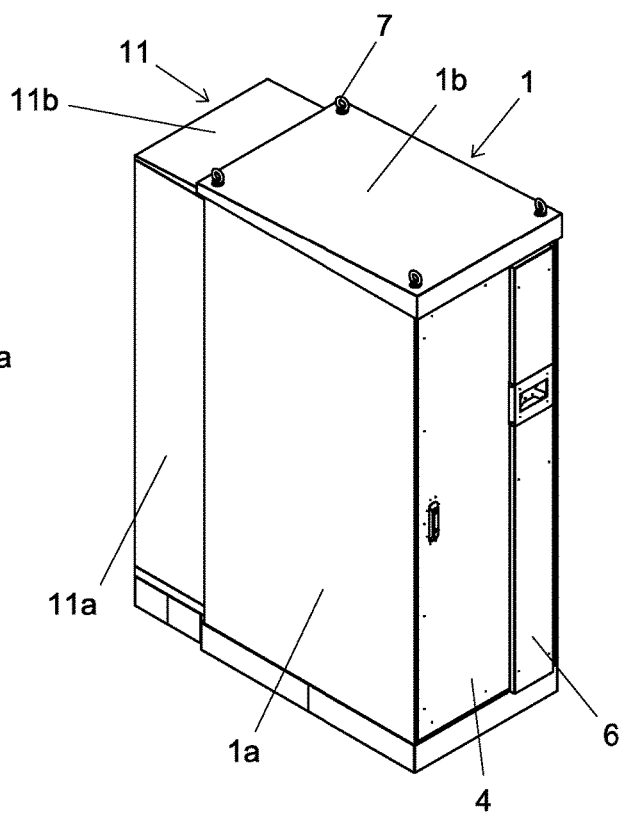
Figure 9:
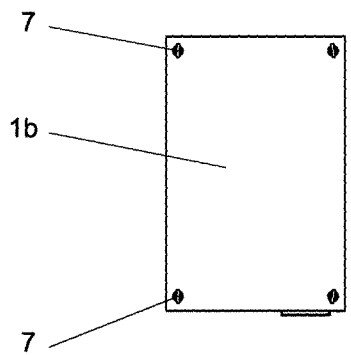
Figure 7:
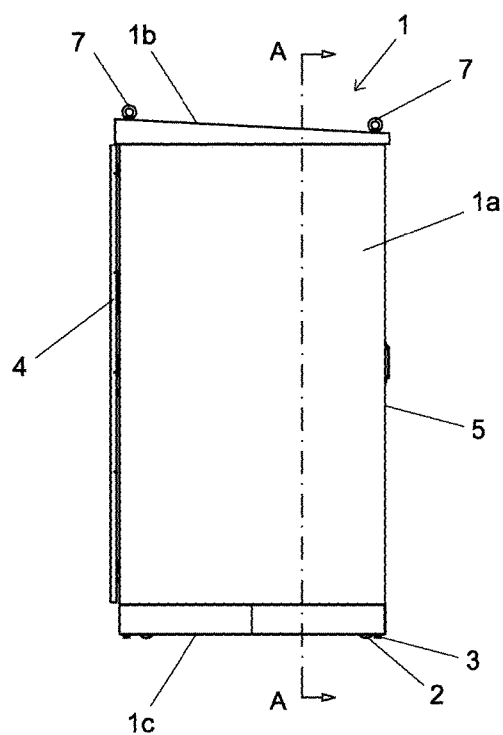
Figure 8:
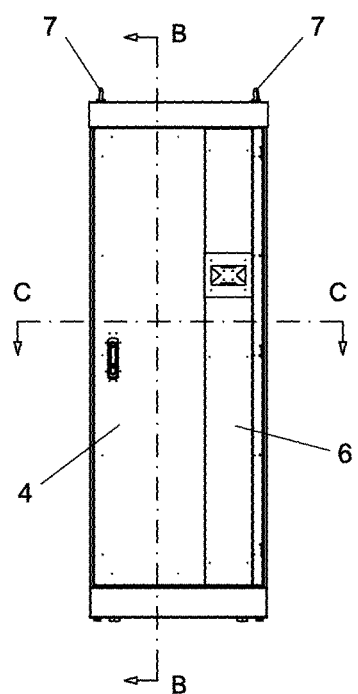
Figure 10:
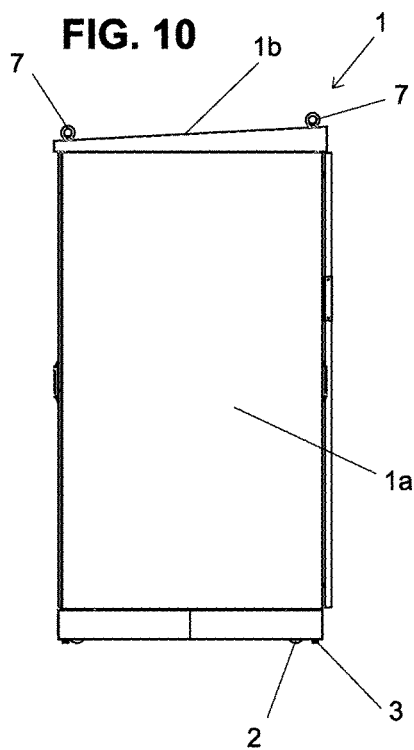
Figure 11:
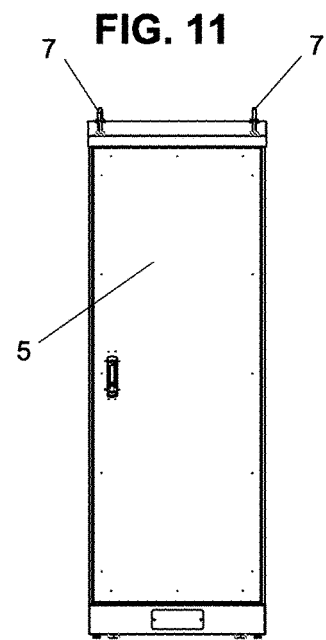
Figure 12:
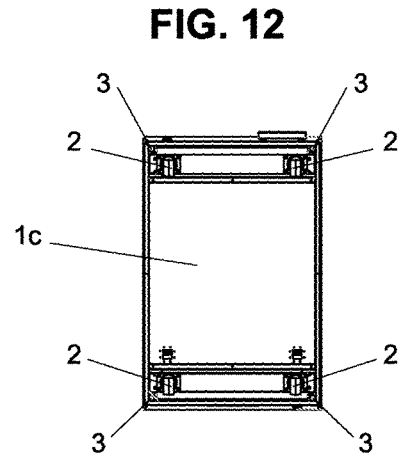
Figure 15:
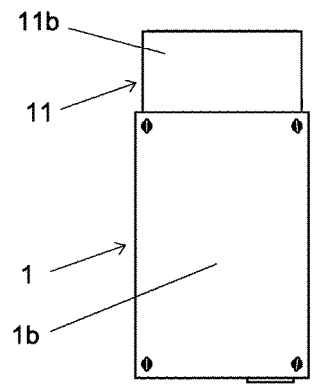
Figure 13:
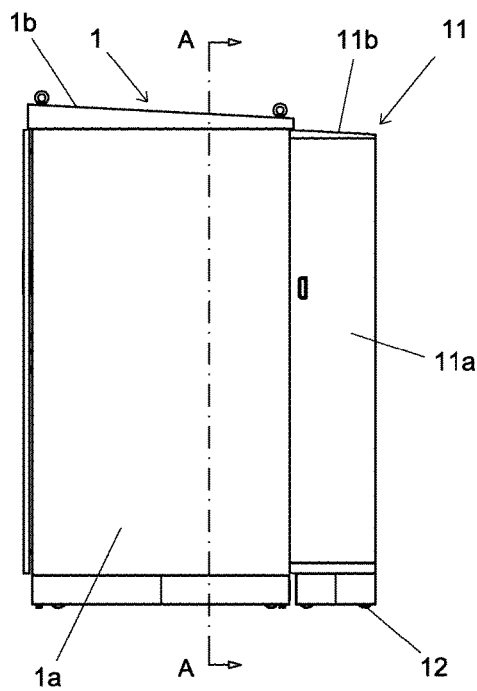
Figure 14:
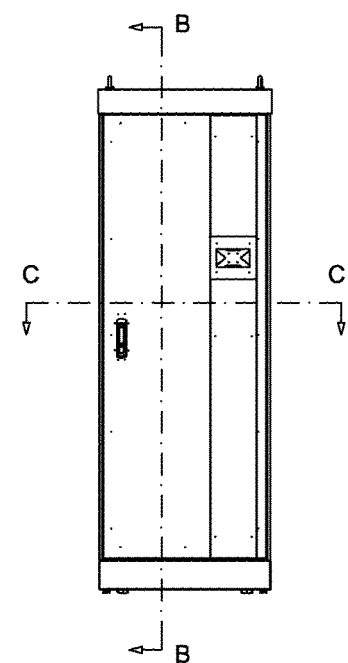

Said rear compartment (11) may vary as to its dimensions, having been herein presented three versions of the same, which couple themselves to the three versions of protective cabinet previously illustrated; in other words, said rear compartments (11) duly couple themselves to the small cabinet (FIG. 4A), to the medium cabinet (FIG. 5A) and to the large cabinet (FIGS. 3 and 6A), the said three versions of rear compartments appearing exactly equal concerning their way of construction and concerning their internal and external details.

As better illustrated in the FIGS. 30, 31 and 32, said rear compartment (11) is manufactured in suitable metallic material, being comprised by lateral (11a), upper (11b), lower (11c) and posterior (11d) walls, all of them equally formed by double steel or similar material plates, whose internal spacing is filled with anti-flame mantle; the upper wall (11b) present itself likewise inclined, with the inclination decreasing from front to behind, to prevent the accumulation of rain water upon the protective cabinet, in the cases in which it is used in open and uncovered areas.

Whereas the posterior wall (11d) of said cabinet (1) present itself provided with an appropriate number of openings (11e), preferably of rectangular shape, for passing the electrical wiring and the components of the system of ventilation/refrigeration/acclimatization of the protective cabinet.

The said rear compartment (11) is likewise provided with swivel rollers (12). In this way, said compartment (11) may be easily dislocated, sometimes getting near, sometimes getting away from the corresponding protective cabinet (1), providing, in this way, easy access to the devices of said ventilation/refrigeration/acclimatization system, whether when of its installation or when of the execution of the required maintenance service.

Finally and also according to the present invention, the protective cabinet herein innovated further present the following construction particularities:

the cabinet is provided with fire detection and fighting system, being that the cables for passing of the wires are provided of insulation against flames;
the protective cabinet walls feature coating capable of resisting fires during a time of until 60 minutes;
the cabinet shows a high degree of safety, designed for IP65 Protection Grade of the norms established by the International Electro-Technical Commission (IEC);
the cabinet is provided with a full monitoring system, which provides sensors of temperature, humidity, smoke, vibration, flooding and opening of door, a "tablet" being foreseen in its front portion (6a), for displaying of the monitored data;
the protective cabinet is provided with switchboard incorporated therein, for electric power distribution; and
the protective cabinet is provided with "no break" also incorporated therein.

With this new constructivity, and with the forecasting of so many innovative particularities, the protective cabinet herein innovated present itself much more practical, functional and efficient than the models already known in the state of the art, besides being extremely safe, thus meeting, advantageously, the purposes of storing and protecting the IT equipment accommodated by them, without, however, turning more expensive its final cost.

The invention claimed is:

1. A protective cabinet for storage and protection of equipment, comprising:
    a cabinet comprising lateral upper and lower walls, the walls defining an internal portion, said internal portion including an anti-flammable material associated therewith;
    said upper wall including a slope that declines from an area proximal to a front portion of the cabinet to an area proximal to a rear portion of the cabinet, and the cabinet further including a plurality of hooks disposed proximal to four corners of the upper part of the cabinet;
    wherein the cabinet further includes at least two pairs of vertical profiles disposed in the internal portion of the cabinet, and a pair of vertical supports disposed in the internal portion of the cabinet;
    wherein said vertical profiles are provided with a multiplicity of orifices and sliding elements associated with rails provided in an upper part of the internal portion of the cabinet;
    wherein said vertical supports are provided with a multiplicity of horizontal shafts, said orifices and said shafts adapted to receive components or devices; and
    said cabinet further comprising a rear compartment, for housing a system of the cabinet selected from the group consisting of a ventilation system, a refrigeration system, and an acclimatization system, wherein said rear compartment comprises lateral, upper, lower and posterior walls defining an interior space, said interior space including an anti-flammable material associated therewith, wherein said upper wall includes a slope that declines from an area proximal to a front portion of the rear compartment to an area proximal to a rear portion of the rear compartment, and wherein said posterior wall is provided with openings for receiving elements of the system of the cabinet.

2. The protective cabinet of claim 1, wherein said vertical profiles have a "U" shaped cross section.

3. The protective cabinet of claim 1, wherein said orifices of the vertical profiles and said horizontal shafts of the vertical supports receive components or devices by friction fit or tying.

4. The protective cabinet of claim 1, wherein said vertical profiles are mounted proximal to the internal faces of the lateral walls, thereby defining a central space for the receiving of components or devices.

5. The protective cabinet of claim 1, wherein said vertical profiles are mounted distant from internal faces of the lateral walls, thereby defining at least one lateral space for the receiving of components or devices.

6. The protective cabinet of claim 1, further comprising a box including circuit-breakers, said box being formed by parallel pipe-shaped bodies, said box further having an open front face closed by a plate, and being provided with front and lateral bracing profiles, wherein said box is positioned in the internal portion of the cabinet.

7. The protective cabinet of claim 1, further comprising cables that include insulation.

8. The protective cabinet of claim 1, wherein the walls of the cabinet include a coating capable of resisting fire for up to 60 minutes.

9. The protective cabinet of claim 1, further comprising a monitoring system, said monitoring system including sensors for one or more of temperature, humidity, smoke, vibration, flooding, and opening of a door.

10. The protective cabinet of claim 1, further comprising an electric switchboard operatively connected to said cabinet.

* * * * *